United States Patent
Farquhar et al.

(10) Patent No.: US 6,609,296 B1
(45) Date of Patent: Aug. 26, 2003

(54) METHOD OF MAKING A PRINTED CIRCUIT BOARD HAVING FILLED HOLES AND A FILL MEMBER FOR USE THEREWITH INCLUDING REINFORCEMENT MEANS

(75) Inventors: Donald S. Farquhar, Endicott, NY (US); Voya R. Markovich, Endwell, NY (US); Kostas I. Papathomas, Endicott, NY (US); Leonard L. Schmidt, Owego, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/562,580

(22) Filed: May 1, 2000

Related U.S. Application Data

(62) Division of application No. 09/259,977, filed on Mar. 1, 1999, now Pat. No. 6,125,531.

(51) Int. Cl.[7] ................................................ H01K 3/10
(52) U.S. Cl. ........................ 29/852; 29/840; 174/260; 427/6
(58) Field of Search .................. 174/260; 29/852, 29/840; 427/6

(56) References Cited

U.S. PATENT DOCUMENTS

| | | |
|---|---|---|
| 4,017,968 A | 4/1977 | Weglin |
| 4,319,708 A | 3/1982 | Lomerson |
| 4,704,791 A | 11/1987 | Chellis et al. |
| 5,450,290 A | 9/1995 | Boyko et al. |
| 5,451,722 A | 9/1995 | Gregoire |
| 5,487,218 A | 1/1996 | Bhatt et al. |
| 5,531,020 A * | 7/1996 | Durand et al. ............... 174/260 |
| 5,557,844 A | 9/1996 | Bhatt et al. |
| 5,571,593 A * | 11/1996 | Arldt et al. .................. 174/167 |
| 5,662,987 A | 9/1997 | Mizumoto et al. |
| 5,766,670 A * | 6/1998 | Arldt et al. ..................... 29/846 |
| 5,822,856 A | 10/1998 | Bhatt et al. |
| 6,005,777 A * | 12/1999 | Bloom et al. ................ 174/252 |
| 6,015,520 A * | 1/2000 | Appelt et al. ................ 264/104 |

* cited by examiner

Primary Examiner—Timothy V. Eley
Assistant Examiner—Alvin J. Grant
(74) Attorney, Agent, or Firm—Scully, Scott, Murphy & Presser; Arthur J. Samodovitz

(57) ABSTRACT

A method of making a circuitized substrate such as a printed circuit board having at least one hole therein which comprises the steps of providing a layer of dielectric, forming at least one (and preferably several) holes therein, providing a fill member including a quantity of fill material and reinforcement means located within the fill material, positioning the fill member on the dielectric over the holes and thereafter applying a predetermined force sufficient to cause only the fill material to be forcibly driven into the accommodating hole(s), not the reinforcement means. Subsequent steps can include forming a layer of circuitry on the substrate's external surface and over the filled holes such that an electrical component such as a ball grid array (BGA), semiconductor chip, etc. may be directly positioned on and/or over the hole(s). A fill member usable with the method is also provided.

13 Claims, 3 Drawing Sheets

METHOD OF MAKING A PRINTED CIRCUIT BOARD HAVING FILLED HOLES AND A FILL MEMBER FOR USE THEREWITH INCLUDING REINFORCEMENT MEANS

This Application is a divisional application of Ser. No. 09/259,977, filed Mar. 1, 1999 now U.S. Pat. No. 6,125,531 and entitled, "Method Of Making A Printed Circuit Board Having Filled Holes And A Fill Member For Use Therewith Including Reinforcement Means", inventors D. S. Farquhar et al.

TECHNICAL FIELD

This invention relates to the manufacture of printed circuit boards and particularly to methods for making such boards wherein at least one and preferably several through holes are provided in the board, e.g., for providing interconnections between an upper conductive layer and internal conductive planes and/or to circuitry located on an opposite side of the board.

Cross-Reference To Copending Applications

In Ser. No. (S.N.) 08/672,292, filed Jun. 28, 1996 and entitled "Manufacturing High Density Computer Systems With Circuit Board Assemblies Having Filled Vias Free From Bleed-Out" (inventors A. Bhatt et al), there is described a circuit board structure and method for making same wherein fill material is positioned (e.g., using injection or heat and pressure) in holes (called "vias") in the board's substrate. A laminate peel-apart structure is used, in addition to one or more photoresist patterns which may be formed. Ser. No. 08/672,292 is now U.S. Pat. No. 5,822,856.

The following patent applications have also been filed from Ser. No. 08/672,292 following a restriction requirement:

Ser. No. 09/030,587, filed Feb. 25, 1998;
Ser. No. 09/033,456, filed Mar. 2, 1998;
Ser. No. 09/033,617, filed Mar. 3, 1998;
Ser. No. 09/021,772, filed Mar. 10, 1998;
Ser. No. 09/041,845, filed Mar. 12, 1998.

In Ser. No. 09/076,649, filed May 12, 1998 and entitled, "Method Of Making A Printed Circuit Board Having Filled Holes And Fill Member For Use Therewith", there is defined a method of filling circuit board holes using a rupturable layer under the fill, which layer opens to allow fill to enter the hole.

BACKGROUND OF THE INVENTION

Many current printed circuit board constructions require one or more external conductive layers, e.g., circuitry and/or pads for mounting components thereon, and, given today's increased functional demands, a plurality of internal conductive planes, e.g., signal, power and/or ground. To provide effective interconnections between components and the board's conductive circuitry and pads, the use of through holes has been adopted wherein several such holes are passed through the board and electrically coupled in a selective manner to internal and external conductive elements. Such holes typically include a conductive, e.g., copper, layer as part thereof which in turn contacts the also typically copper circuitry and pads.

The term "through hole" or simply "hole" as used herein is meant to include both conductive and non-conductive apertures which may extend entirely through the circuit board or only partly therethrough (such holes are often called "vias" in the art), including between only one or more internal layers without being externally exposed. Examples of various circuit board structures which include the use of holes of these types and various methods of making such holes in circuit boards are defined in several published documents, including the following U.S. Letters Patents, issued on the dates identified:

| | | |
|---|---|---|
| 4,017,968 | Weglin | Apr. 19, 1977 |
| 4,319,708 | Lomerson | Mar. 16, 1982 |
| 4,704,791 | Chellis et al | Nov. 10, 1987 |
| 5,450,290 | Boyko et al | Sep. 12, 1995 |
| 5,451,722 | Gregoire | Sep. 19, 1995 |
| 5,487,218 | Bhatt et al | Jan. 30, 1996 |
| 5,557,844 | Bhatt et al | Sep. 24, 1996 |
| 5,571,593 | Arldt et al | Nov. 5, 1996 |
| 5,662,987 | Mizumoto et al | Sep. 2, 1997 |

Printed circuit boards of the aforementioned type are particularly adapted for having one or more (usually several) electrical components, e.g., semiconductor chips, capacitors, resistors, etc., mounted on an external surface thereof and coupled to various, selected internal conductive planes within the board's dielectric substrate. As demands for increased levels of integration in semiconductor chips and other electrical components continue, parallel demands call for concurrent increased functional capabilities, e.g., increased circuit densities, in printed circuit boards adapted for use with such components. Such demands further emphasize the growing need for more closely spaced electrical components on the board's outer surfaces. For those boards possessing greater functional capabilities and therefore which use several through holes therein, it is highly desirable to position the electrical components directly over the holes to maximize board real estate while assuring a compact, miniaturized final board product.

Demands such as those above are particularly noteworthy when it is desirable to couple what are referred to as ball grid array (BGA) components directly onto the board's outer conductive layer(s). Such components include a plurality of highly dense conductors, e.g., solder ball elements, closely positioned in a fixed pattern on the component's undersurface. Such is also the case for directly mounted semiconductor chips (also known as direct chip attach or DCA components) wherein a dense pattern of several minute solder balls are arranged on the chip's compact and extremely small undersurface (that directly facing the underlying circuit board). To successfully accommodate such components, filling of the board's holes with conductive material (called "fill") has been tried, with one or more examples defined in the above-identified issued Letters Patents. To accomplish such filling, however, it is typically necessary to utilize a mask or the like with pre-formed, e.g., drilled or punched, apertures therein which coincide with the desired hole pattern. Once provided in the necessary precise alignment, various filler materials have been attempted, including both electrically conductive and non-conductive. One example of such a filler is defined in U.S. Pat. No. 5,487,218, wherein the composition is an organic polymeric material with an optional particular filler added thereto to modify the thermal and/or electrical properties of the composition. One excellent reason for such modification is to approximately match the coefficients of thermal expansion of both board substrate material and contained filler.

In an approach somewhat different from using an apertured mask, a rupturable supporting member having fill thereon is used. Pressure is applied to the fill, resulting in rupturing of the support layer in the vicinities of the circuit board substrate's holes. Fill thus fills these holes and the support member and fill remainder are removed. This approach is defined in copending application Ser. No. 09/076,649, mentioned above.

It is believed that a new and unique method of making a printed circuit board having at least one (and possibly several) holes therein which can be filled in a more expeditious manner than heretofore described wherein performed masks or similar structures are used would represent a significant advancement in the art. It is further believed that a printed circuit board produced in accordance with such a method would also constitute a significant art advancement, as would a fill member usable during the method for providing expeditious hole fill.

OBJECTS AND SUMMARY OF THE INVENTION

It is, therefore, a primary object of the present invention to enhance the art of printed circuit board manufacture by providing a new and unique method of making such a board wherein filled holes are used.

A further object of the invention is to provide such a method which can be performed in an expeditious manner adaptable for mass production, thereby reducing the costs of making such a board end product.

It is an even further object of the invention to provide such a method which can be successfully accomplished without the need for a mask or the like having preformed openings therein which must necessarily align with the already formed board hole pattern.

It is yet a further object to provide a fill member that can be effectively used during circuit board manufacturing to assure precise and expeditious filling of the board's formed holes.

These and other objects are met by the present invention which defines a method for making a circuitized substrate (one prime example being a printed circuit board) which comprises providing a layer of dielectric material including first and second sides, forming at least one hole within the first side of the layer of dielectric material, providing a fill member including first and second sides and having a peripheral portion, the fill member further including a quantity of fill material and reinforcement means positioned therein and formed part thereof, positioning the fill member on the first side of the layer of dielectric material and over the at least one hole, and applying a predetermined force onto the fill member sufficient to cause at least some of the fill material and not the reinforcement means to substantially fill the at least one hole.

In accordance with another aspect of the invention, there is provided a fill member for use in filling holes in a circuitized substrate. The fill member comprises a layer of fill material, reinforcement means positioned therein and forming part thereof, the fill member adapted for having a predetermined pressure applied thereto when the fill member is positioned on the circuitized substrate such that only the fill material and not the reinforcement means will enter the hole.

BEST MODE FOR CARRYING OUT THE INVENTION

For a better understanding of the present invention, together with other and further objects, advantages and capabilities thereof, reference is made to the following disclosure and appended claims in connection with the above-described drawings.

Figure 1:
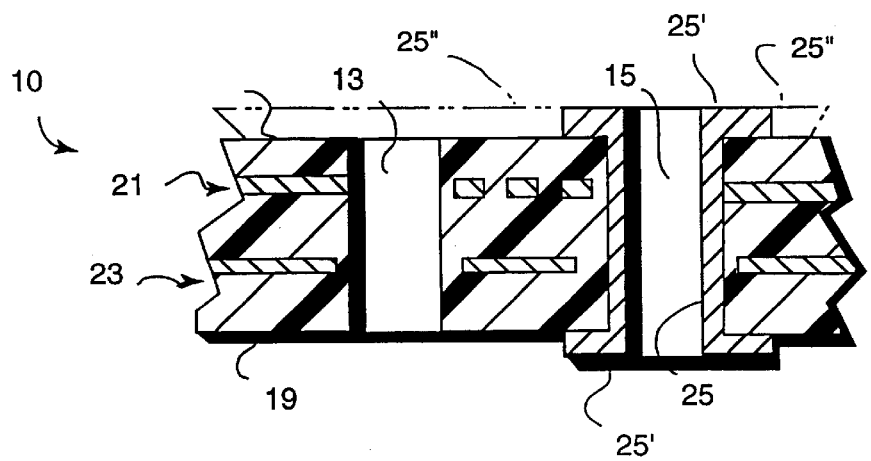
FIGS. 1–7 illustrate the various steps of performing the method of the present invention, in accordance with a preferred embodiment thereof.

In FIG. 1, there is shown a multi-layered dielectric member 10 which includes a plurality of layers of dielectric material which, when laminated, form a substantially singular dielectric structure as shown. Member 10 is shown to include two holes 13 and 15 therein, which extend from the member's upper surface 17 to the undersurface 19. Member 10 preferably includes a plurality of internal conductive planes 21 and 23 which may function as signal, power or ground members in the final structure. In the embodiment shown in FIG. 1, member 10 is shown to include only two planes (21, 23) and two holes (13, 15), but it is understood that the invention is not limited to these examples in that in the broadest aspect of the invention, only one hole is needed in combination with one layer of conductive circuitry either on the top or bottom surfaces of member 10 or located internally.

Internal conductive planes 21 and 23 are preferably of copper and the multi-layered structure shown is preferably made using conventional lamination processes wherein individual layers of dielectric and conductive material are stacked and laminated. Further description is not believed necessary for this known procedure.

Holes 13 and 15 which, as stated above, may extend entirely through the dielectric member or between any two or more adjacent conductive planes, including extending only a relatively short distance within the dielectric member from upper surface 17. These holes are preferably formed in the laminated structure by drilling, punching or laser ablation. In the example depicted, hole 13 is shown as not including any conductive material on its internal surfaces, while hole 15 is of the more conventional type of such holes and includes a thin conductive layer 25, e.g., copper, on the internal walls as well as forming external lands 25' of the substrate's outer surfaces that substantially surround the hole at these two locations. The conductive layer 25 (including lands 25' if formed) is preferably applied using a known plating operation, and further description is not believed necessary. It is to be understood that the dielectric member 10 may include a continuous metallic (e.g., copper) layer thereon, which layer in turn may be circuitized prior to or after the following steps. Such a layer is represented by the numeral 25" and shown in phantom in FIG. 1.

A preferred dielectric material for member 10 is known fiberglass-reinforced epoxy resin (also known as "FR4"), but other materials, e.g., polytetrafluoroethylene, cyanates, bismaleimide triazines (BT) and compositions with epoxy polyimide film or reinforced, woven or non-woven in nature dielectric, may be utilized. In one example, a dielectric member having a total of two internal conductive planes, a total of about 1,000 holes per square inch of one of the member's two external surfaces, and an overall thickness of about 0.020 inch may be formed. Again, however, the invention is not limited to these particular values or numbers.

Figure 2:
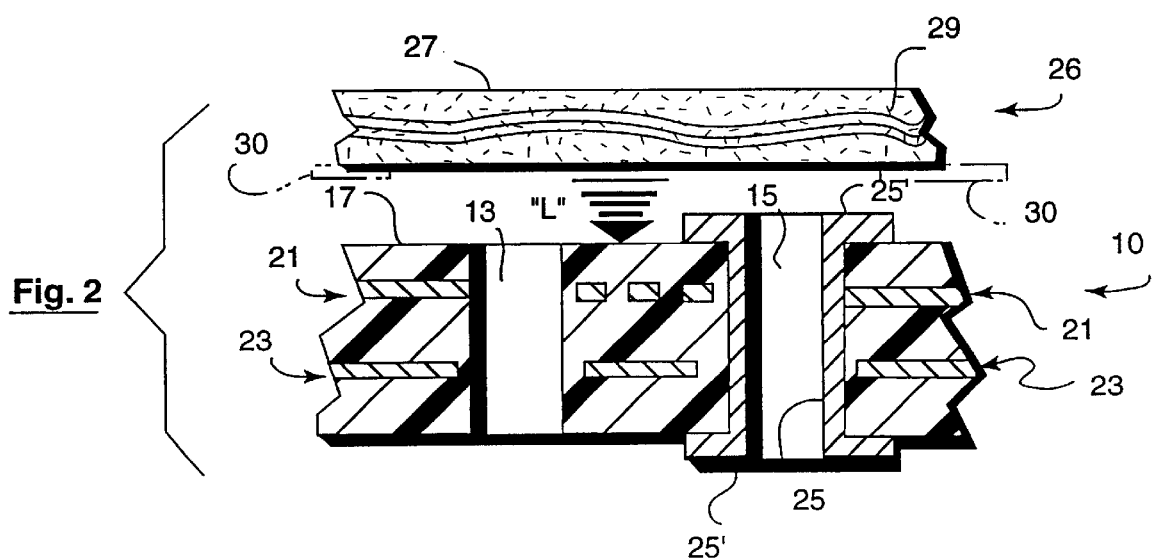

In FIG. 2, a fill member 26 including a quantity of fill material 27 having reinforcement means 29 located substantially within the fill or forming a part thereof is lowered (direction "L") onto the upper surface 17 of member 10. In a preferred embodiment, means 29 is preferably positioned within the fill material prior to positioning the resulting subassembly 26 atop member 10. This is not meant to limit the invention, however, in that the fill 27 may be initially positioned on surface 17 and the reinforcement means 29 thereafter positioned within this initial layer. In one example, means 29 is a thin layer comprised of woven fiberglass with the corresponding fill material being conductive copper paste. In such an example, layer 29 may possess a thickness of only about 0.0005 inch and the paste material an initial thickness of about 0.005 inch. With the layer 29 located substantially within the fill material 27, the combined thickness is still only about 0.005 inch. Conventional fiberglass represents an excellent choice of reinforcing materials for use in the invention. An alternative material is polytetrafluoroethylene. Means 29 may be provided as at least one curvilinear, substantially porous (albeit very thin) layer or as multiple strands of such material, or a combination of both. Several other plastic materials, as well as some metals, are readily possible for use in the invention and may be in the form of thin, apertured foils. Positioning and subsequent removal of member 26 may be enhanced by using a non-adhering material 30 (in phantom in FIG. 2) which is applied to the member's undersurface 19, e.g., around the periphery of member 26. Examples of such non-adhering material include polytetrafluoroethylene and polyethylene. Only a thin layer 30 is applied to member 26. Once lamination of member 26 and substrate 10 occurs, the non-adhering material enables ready removal of the remaining member 26 on upper surface 17, e.g., using a peeling process.

Figure 3:
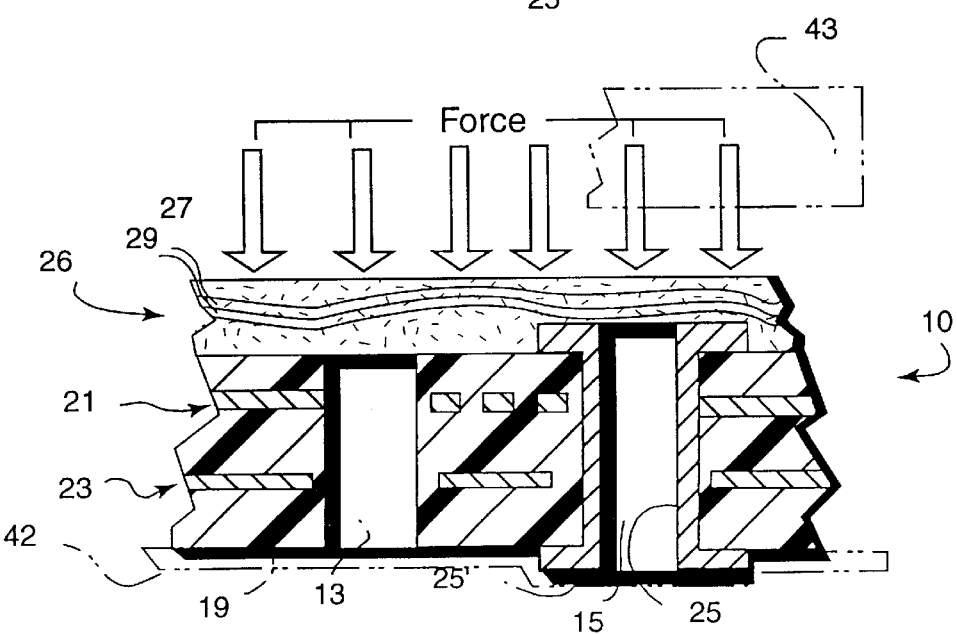
Figure 4:
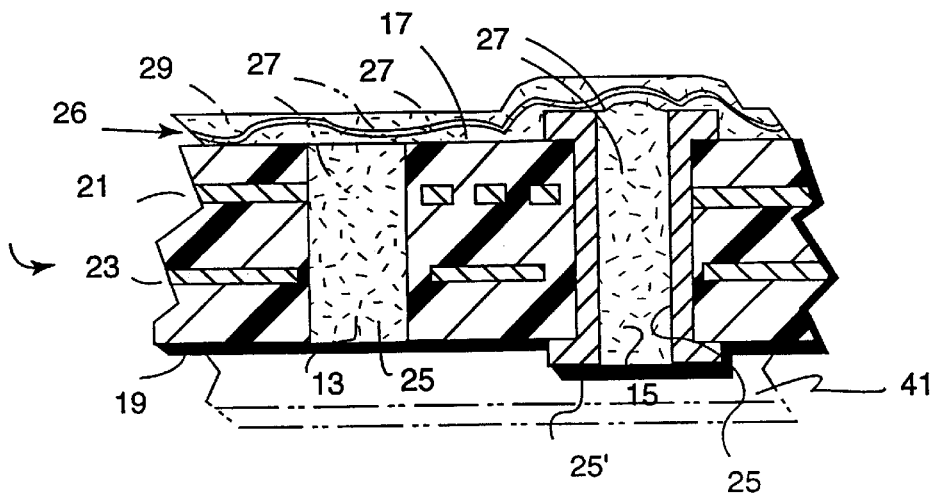

In FIG. 3, with fill member 26 in position, a predetermined force is applied (as indicated by the six directional arrows) onto the member which, as shown in FIG. 4, is sufficient to cause the member to deform and allow at least some of the fill material 27 to flow within the previously covered holes 13 and 15. The preferred procedure for accomplishing such deformation is to utilize known lamination procedures, and, in one specific example of the invention (using the aforementioned materials), the dielectric member 10 and subassembly 26 were laminated at a pressure of from about 100 pounds per square inch (p.s.i.) to about 700 p.s.i. In a specific example, a pressure of about 300 p.s.i. was utilized. Such lamination occurred within a predetermined temperature range of from about 120° C. to about 240° C. In the foregoing specific example wherein the member and subassembly were subjected to a pressure of about 300 p.s.i., such a procedure was conducted at a temperature of about 185° C.

Most surprisingly, as a result of the aforementioned application of force, the reinforcing material 29 was conveniently compressed (as seen in FIG. 4) in such a manner so as to allow only the fill material 27 into holes 13 and 15. While the reinforcing material remains substantially solid, the fill material liquifies and flows in response to the pressure gradient. During this process, the reinforcing material acts as a sieve to allow the fill material to pass therethrough into the lower openings. Being a sieve, it allows substantially all of the constituents of the fill material to pass.

As seen in FIG. 4 (and partially in FIG. 5), the compressed fill member 26 assumes a thinner configuration as a result of the aforedefined force application. As further seen in FIG. 4, member 10 is preferably positioned on a suitable support structure (e.g., base 41), shown in phantom. Base 41, if used, is preferably comprised of a polymeric material such as polytetrafluoroethylene. Alternatively, a layer of backing material 42 (shown in phantom in FIG. 3) may be laminated on undersurface 19 to prevent fill material from escaping holes 13 and 15. An example of such material is polytetrafluoroethylene, having a thickness of about 0.002 inch. Material 42 may be removed following hole fill. With further attention to FIG. 3, it is possible to utilize another means for forced application onto member 26 than to use the defined lamination process.

Figure 5:
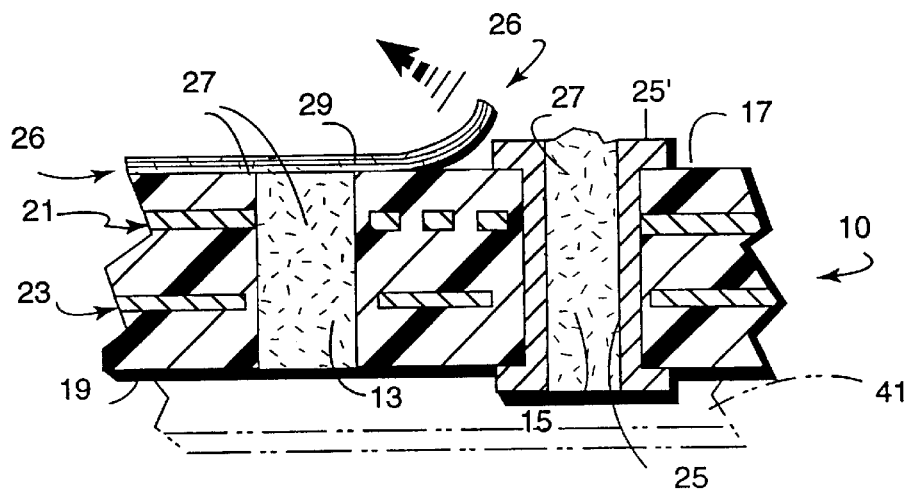
Figure 6:
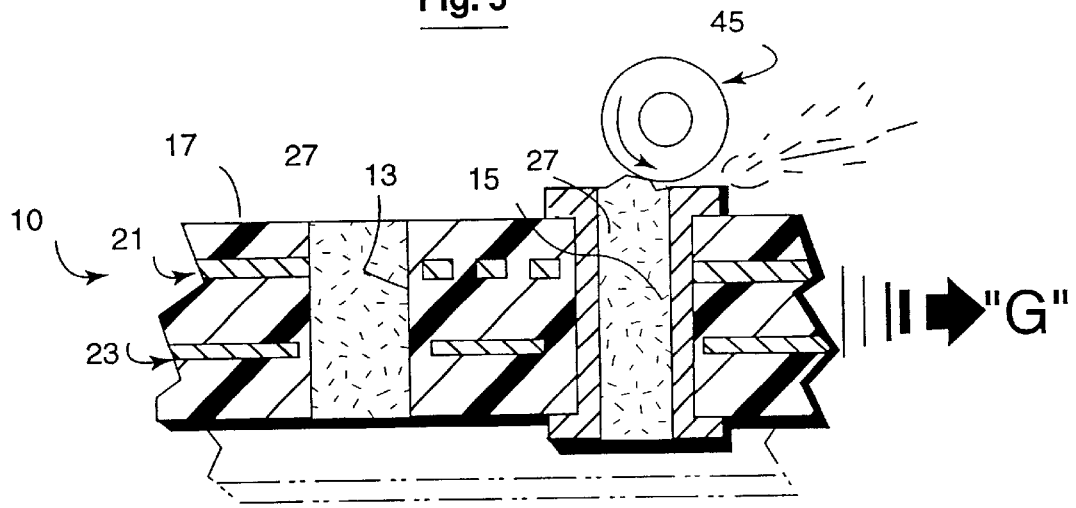

In FIG. 5, the portion of the remaining fill material and reinforcing layer(s) which do not flow into holes 13 and 15 (that being only that part of same located on the member's upper surface 17) is removed. Notably, if a material such as woven fiberglass is used for reinforcing layer(s) 29, said material will remain continuous after fill dispersion and thereby facilitate removal of any remaining fill and reinforcing material located on the substrate's upper surface. This removal is preferably accomplished utilizing a shearing or peeling operation. Any residue remaining on the surface may be removed by other suitable means (e.g., a mechanical grinder or polisher as shown in FIG. 6). Such removal is enhanced as a result of the substantial non-adherence of the fill material 27 with respect to upper surfaces 17 and 25' (or 25", if used). In other words, the fill material preferentially adheres to the reinforcing material compared to the external surface of member 10.

In FIG. 6, the aforementioned optional grinding step may be performed utilizing a mechanical grinder 45 which moves over the member's top surface 17 or, alternatively, remains fixed in position with the underlying member moving thereunder (e.g., in direction "G"). This step may include simply grinding away any excessive fill material 27 (shown projecting above land 25') to form a planar land-fill structure. This step may further include partial grinding of the land 25' copper material so as to assure planarity thereof as well. Such grinding is within the knowledge of one of ordinary skill in the art and further description is not believed necessary.

Figure 7:
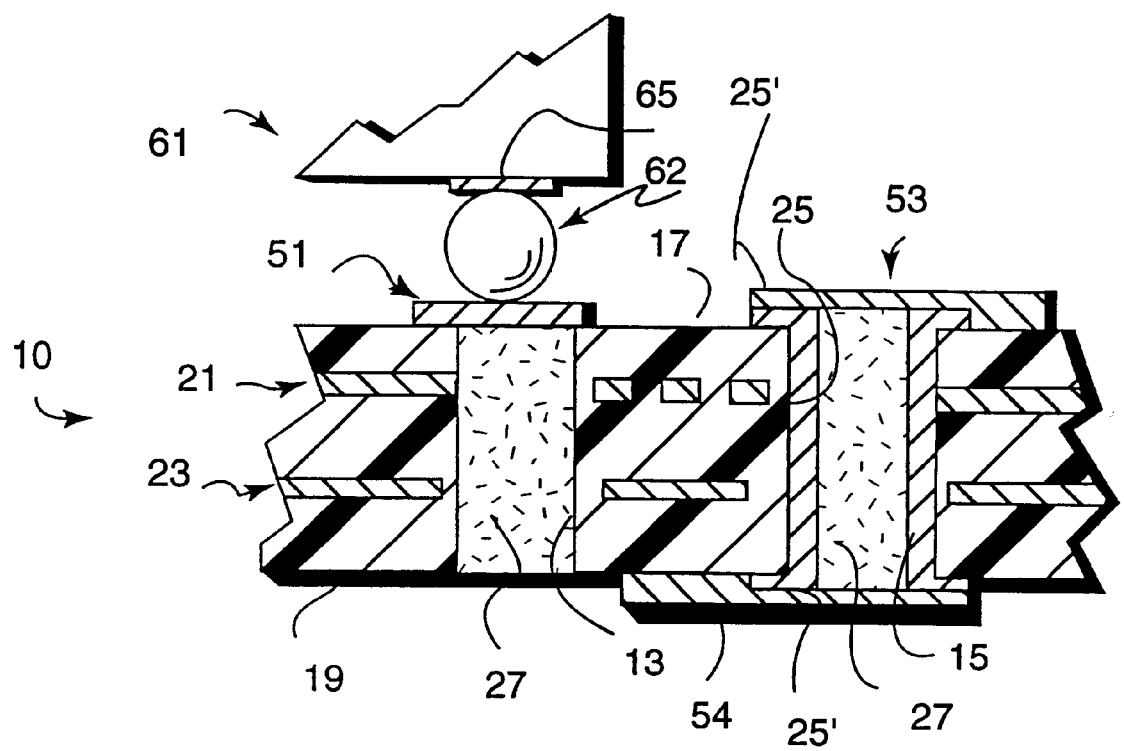

In FIG. 7, conductive members 51 and 53 are positioned over the upper exposed surface of the fill material 27 within holes 13 and 15 (and the top surface of land 25'), the formed fill material able to provide adequate support therefore. In a preferred embodiment, the conductive members 51 and 53 may be provided by a plating operation, many of which are known in the art. In such an example, member 51 represents a conductive pad, while member 53 may comprise a circuit line which in turn is coupled to another pad (not shown). Additionally, it is also possible to form one or more conductive members 54 on the undersurface 19 of member 10 (and on the lower land's external surface), thus even further increasing the available real estate for the finished circuitized substrate. Such conductive member 54 may also comprise a pad or line or the like structure, and in turn be electrically coupled to another electrical component (not shown).

In FIG. 7, an electrical component 61 (e.g., a semiconductor chip) is positioned atop conductive member 51 and electrically coupled thereto using a suitable conductive structure. In a preferred embodiment, this conductive structure is preferably a solder ball 62, one example of which may comprise 63:37 tin:lead solder. The solder ball in turn is electrically coupled to a conductive site 65 of the chip. It is, of course, understood that the invention is readily adaptable to having conductive elements such as semiconductor chips having several solder balls or the like for coupling the chip to the underlying circuitized substrate formed in accordance with the teachings herein. In one example, it is possible to effectively couple a semiconductor chip having 1000 contact sites onto selected ones of the substrate's conductor pads or similar structures, which, as described, are adapted for receiving the chip's solder balls. It is also within the scope of the invention to couple other electrical components to the substrate as formed in accordance with the teachings herein. Examples of such components may include resistors, capacitors, etc., several of which are known in the art. Such components may include projecting metallic leads or the like instead of solder balls as shown in FIG. 7. The invention is thus readily adaptable to use with several different types of components and in several different environments.

The preferred method of providing conductive members 51, 53 and 54 is to use a plating operation, several of which are known in the art. In one example, electroplating was utilized and conductive members having a thickness of only about 0.0005 inch were formed on the opposing surfaces of member 10.

It is further seen in FIG. 7 that a conductive path is thus provided between conductor 51 to the first internal plane 21, provided the fill material 27 is an electrically conductive paste such as mentioned above. In the case of the other hole 15, a conductive path is formed from conductive member 53 to the first conductive plane 21 and further to the second conductive member 54. In this embodiment, it is understood that a non-conductive fill material 27 may be utilized because the internal conductive layer 25 of hole 15 provides such electrical connection. Although internal conductive layer 23 is not shown as being electrically coupled to either hole 13 or 15, this layer is shown in a representative manner only to illustrate that more than one such internal conductive layers may be utilized. It is, of course, understood that layer 23 may be directly connected to one or both of holes 13 and 15, and therefore, possibly electrically coupled to layer 21 and/or conductive members 53 and 54. Several other circuit combinations are possible within the scope of this invention and further description is not believed necessary.

Figure 8:
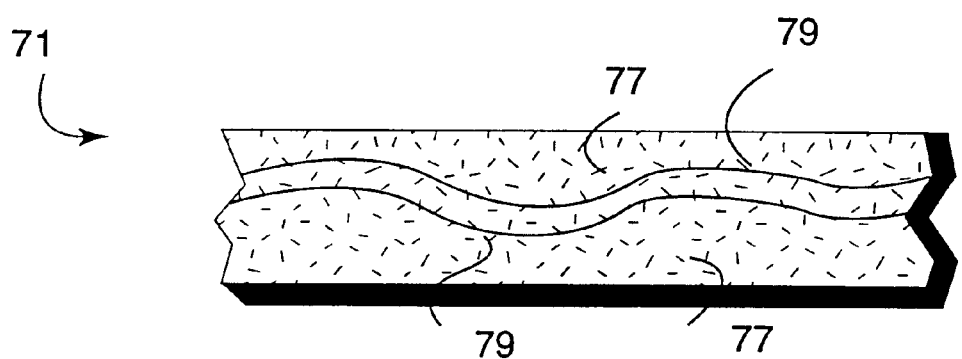
FIG. 8 illustrates a fill member in accordance with one embodiment of the invention.

In FIG. 8, there is shown a fill member 71 in accordance with a preferred embodiment of the invention. In this example, fill member 71 comprises a quantity of fill material 77 and a reinforcing means 79 in the form of one or more internal layers or fibers of the aforementioned materials.

The preferred fill material 77 is a composition having a low coefficient of thermal expansion and which includes a binder selected from the group of binders consisting of aliphatic, cycloaliphatic, novolac, phenolic and Bisphenol A glycidyl ether epoxy resins, cyanate ester resins, polyimide resins and bis-maleimide resins. Examples of particles that may also form part of such fill material for use in the embodiment of FIGS. 1–7, include silica, alumina, aluminum nitride, zinc oxide, boron nitride, magnesium, clay, silicate, etc. The fill, using the aforementioned support layer thicknesses, may have a thickness of about 0.001 inch to about 0.005 inch. These fills can be electrically conductive, or not, depending on ultimate product usage. By low thermal expansive is meant an expansion rate approximately the same as that of the dielectric member (in the out-of-plane direction). In one embodiment, the fill material may comprise a composition comprising from about 5% to about 65% by composition weight of a binder wherein the binder comprises about 25% to about 100% by binder weight of one or more of the aforementioned resins, about 0% to about 78% by binder weight of a curing agent, and a catalyst in an amount sufficient to accelerate the cure of the resin. This fill composition may also include from about 35% to about 95% by composition weight of one or more of the aforementioned particulates. Other materials, including other epoxy resins, polyimides, bis-maleimides, cyanate esters and combinations thereof, may be used as binders.

The fill member of FIG. 8 is preferably utilized as a source of fill material in circuitized substrates such as those mentioned herein. As such, the member 71 is positioned atop a dielectric/conductive member such as member 10 and both components then subjected to lamination or similar application of heat and pressure such that the member is in direct contact with the underlying substrate and will deform in accordance with the teachings provided herein. Such a fill member (one comprised of one or more of the foregoing fill composition materials) preferably has an initial thickness of from about 0.002 inch to about 0.020 inch.

When using the above materials, a preferred reinforcement means which is located within the composition for adding strength to the combined member (e.g., 71 in FIG. 8) is a woven material, a preferred example being fiberglass. Such material will preferably include fibers having a thickness of only about 0.0005 inch, and, being internally positioned in the fill composition, will not add appreciably to the overall member thickness.

Surprisingly, it was discovered that utilization of the above-defined teachings resulted in substantially no surface residue after peeling when compared to similar processes using masks (e.g., drilled copper material) atop the underlying substrate and having preformed apertures therein through which fill material is pressed. Hole fill was also consistent over a variety of hole sizes having internal diameters ranging from about 0.008 inch to about 0.050 inch. The present invention thus represented a significant advancement over earlier procedures wherein formed masks were required.

Thus there has been shown and described a method of making a circuitized substrate and a fill member for use in such a method wherein the substrate's holes are quickly filled with desired fill material and the remaining (external) portion of the fill member is removed. Subsequent processing (e.g., circuitization) is also readily possible atop the filled holes to thus increase the operational current densities for the resulting end product (e.g., a printed circuit board having one or more semiconductor chips mounted thereon).

While there have been shown and described what are at present considered the preferred embodiments of the invention, it will be obvious to those skilled in the art that various modifications made be made therein without departing from the scope of the invention as defined by the appended claims.

What is claimed is:

1. A fill member adapted for substantially filling a hole in a circuitized substrate, said fill member comprising:
   a layer of fill material; and
   reinforcement means within said layer of fill material, said reinforcement means is in the form of a porous layer, strands or a combination of a porous layer and strands;
   said fill member adapted for having a predetermined pressure applied thereto where said fill member is positioned on said circuitized substrate such that only said fill material, but not said reinforcement means, will enter said hole.

2. The fill member of claim 1, wherein said fill material comprises a binder selected from the group of binders consisting of aliphatic, cycloaliphatic, novolac, phenolic and Bisphenol A glycidyl ether epoxy resins, cyanate ester resins, polyimide resins and bis-maleimide resins.

3. The fill member of claim 2, wherein said fill composition comprises:
 a. from about 5% to about 65% by composition weight of said binder, comprising:
  I. about 25% to about 100% by binder weight, of one or more of said resins;
  ii. about 0% to about 78% by binder weight of a curing agent;
  iii. a catalyst, in an amount sufficient to accelerate the cure of said resin; and
 b. from about 35% to about 95% by composition weight of electrically conductive and non-conductive particulates.

4. The fill member of claim 3 wherein said particulates are thermally conductive.

5. The fill member of claim 1 wherein said fill material has a thickness of only from about 0.005 inch.

6. The fill member of claim 1 wherein said reinforcement means in the form of said strands and said strands are woven.

7. The fill member of claim 6 wherein said woven strands are fiberglass.

8. The fill member of claim 7 wherein said fiberglass is comprised of glass fibers having a thickness of about 0.0005 inch.

9. The fill member of claim 1 further including a layer of non-adhering material adapted for being positioned on said circuitized substrate between said fill member and said substrate.

10. The fill member of claim 9 wherein said layer of non-adhering material is comprised of polytetrafluoroethylene or polyethylene.

11. The fill member of claim 1 wherein said reinforcing means remains substantially solid and said fill material liquifies during application of said predetermined pressure onto said fill member.

12. The fill member of claim 1 wherein said fill material has a coefficient of thermal expansion substantially similar to the coefficient of thermal expansion of said circuitized substrate.

13. The fill member of claim 1 wherein said fill member substantially fills said hole in said circuitized substrate without use of a mask.

* * * * *